United States Patent [19]

Manus

[11] 3,828,425

[45] Aug. 13, 1974

[54] METHOD FOR MAKING SEMICONDUCTOR PACKAGED DEVICES AND ASSEMBLIES

[75] Inventor: Donald J. Manus, Dallas, Tex.

[73] Assignee: Texas Instruments Incorporated, Dallas, Tex.

[22] Filed: Oct. 16, 1970

[21] Appl. No.: 81,354

[52] U.S. Cl. .......................... 29/590, 29/588, 29/589

[51] Int. Cl. .......................... B01j 17/00

[58] Field of Search .......... 29/589, 590, 591, 588; 317/235 G, 235 M

[56] References Cited

UNITED STATES PATENTS

| | | | |
|---|---|---|---|
| 3,039,175 | 6/1962 | Dixon | 29/589 |
| 3,136,050 | 6/1964 | Trueb et al. | 29/589 |
| 3,198,999 | 8/1965 | Baker et al. | 29/589 |
| 3,268,309 | 8/1966 | Frank et al. | 317/234 M |
| 3,283,224 | 11/1966 | Erkan | 29/588 |
| 3,450,962 | 6/1969 | Farree et al. | 317/234 G |
| 3,597,658 | 8/1971 | Rivera | 317/234 G |
| 3,618,203 | 11/1971 | Pryor | 317/234 G |
| 3,620,692 | 11/1971 | Franklin | 317/234 M |

*Primary Examiner*—Charles W. Lanham
*Assistant Examiner*—W. C. Tupman
*Attorney, Agent, or Firm*—Harold Levine; Edward J. Connors, Jr.; William E. Hiller

[57] ABSTRACT

A semiconductor package fabricated from metals of atomic number less than 32 for use in any environment including a high radiation environment, and a process for fabricating a semiconductor package with reproducible electrical characteristics using mass production techniques. In the method, a base member, such as a metal header having metal terminal conductors and an area for attaching a semiconductor body, is first coated at least in part with a Soft Metal, such as copper, and then coated with a Hard Metal, such as nickel, or if a molybdenum-manganese metallized ceramic header is used, at least the metallization is coated with a metal strike, such as nickel, prior to coating the header with the Soft and Hard Metals, and then the base member is heat treated to form a header having an improved semiconductor body attachment area and electrical conductors.

11 Claims, 6 Drawing Figures

INVENTOR
Donald J. Manus

BY Alva K. Bandy

ATTORNEY

METHOD FOR MAKING SEMICONDUCTOR PACKAGED DEVICES AND ASSEMBLIES

BACKGROUND OF THE INVENTION

1. Field of the Invention

This invention relates to semiconductor devices or assemblies and more particularly to a method for fabricating, through mass production techniques, a radiation hardened semiconductor packaged device having a package base with an improved semiconductor body attachment area and improved package base terminal conductors.

2. Description of the Prior Art

Heretofore, semiconductor packages commonly referred to as headers, such as, for example, metal or ceramic base headers for semiconductor devices or assemblies, have been given a high purity gold plating of controlled thickness to provide improved semiconductor body attachment yields, and to provide improved conductor wire interconnection yields.

It has been found that heavy metals, such as those having an atomic number in the periodic chart above 32, and in particular gold and silver when subjected to high energy radiation such as x-rays, for example, absorb a large amount of energy in a very short time. The energy is absorbed faster than the metal can expand and produces a mechanical shock which seriously shortens device life.

Efforts to use metallurigically compatible low atomic number (Z) materials, i.e., materials having an atomic number below 32, and materials which would reduce the cost of the package, having been directed to the use of: aluminum bonding pads on semiconductor elements such as, for example, diodes, transistors, or integrated circuits; aluminum terminal pads on the electrical conductors of semiconductor packages; and fine aluminum wires to electrically interconnect the semiconductor elements and semiconductor package electrical conductors.

It has been found that when using aluminum on the standard type package such as, for example, the flatpack, dual-inline, or transistor TO-type, the aluminum must be selectively deposited upon the semiconductor body attachment area and the conductors or leads of the packages. For example, the standard metal headers of the industry, such as the transistor TO-type, are made of an iron-nickel-cobalt alloy sold under the trademark "Kovar." When the header was coated with aluminum, and the aluminum-germanium alloying process described in U.S. Pat. application Ser. No. 51,255, filed June 30, 1970, now abandoned in favor of continuation application Ser. No. 280,399, filed Aug. 14, 1972, was used to attach a semiconductor body to the aluminum metallized header, the aluminum-germanium alloy spread rapidly over the aluminum coating and an effective bond could not be made between the semiconductor body and header. Selective deposition of the aluminum in some respects eliminated this problem.

Selective deposition of a metal, such as aluminum on headers, can be accomplished by two known processes: First, the metal can be evaporated through a metal mask; and secondly, the metal can be evaporated or plated over the entire header or package and photoresist applied in the desired pattern and the excess metal etched off. The metal mask method is objectionable in that it is very difficult from a mass production viewpoint to make a metal mask having the required tolerances. The photofabrication or pattern etching process is a tedious one and from a mass production viewpoint, can have deleterious effects on the header, e.g., peeling and contaminating the remaining aluminum.

To avoid selective deposition of aluminum on the semiconductor body attachment area and the conductors or leads sometimes referred to as header posts, and to provide an economical radiation hardened semiconductor packaged device, other low atomic number materials (below 32), such as nickel, cobalt, iron, manganese, chromium, and vanadium, were considered. It was found that the aluminum-germanium alloy or laminate used for alloying a semiconductor body to the header did not spread unsatisfactorily on these metals, but apparently because of their hardness, leads, such as aluminum leads, could not be bonded to these metals with satisfactory reproducible results by vibratory bonding techniques.

SUMMARY OF THE INVENTION

It is an object of this invention to provide an efficient, and inexpensive process for fabricating a semiconductor package to which leads, such as aluminum leads, can be bonded with acceptable reproducible results by vibratory bonding techniques.

It is another object of this invention to provide a convenient and accurate method for mass producing semiconductor packaged devices.

It is still another object of this invention to provide a process for making a semiconductor packaged device able to withstand the effects of a high radiation environment.

It is yet another object of this invention to provide a process for making a semiconductor packaged device utilizing metals other than noble metals Before proceeding with the description of the invention, it is desirable to define two phrases which will be used herein — a "hard metal" and a "soft metal." A "hard metal" is a metal having an atomic number less than 32 on which an alloy, such as aluminum-germanium, will not readily spread during an alloying process for attaching a semiconductor body to a header, and which will substantially prevent a "soft metal" from contaminating the semiconductor body. A "soft metal" is a metal having an atomic number less than 32 which when covered by a "hard metal" will allow an electrical lead such as an aluminum lead to be bonded by vibratory bonding techniques to the "hard metal" with ease and with reproducible results, both as to electrical characteristics and strength of bonded joints.

Briefly stated, this invention comprises a process for fabricating a radiation hardened semiconductor device or assembly from a standard semiconductor package, such as, for example, the flatpack, dual in-line, or transistor TO-type packages, by first coating the package base with a Soft Metal followed with a coating of a Hard Metal. If the package has a molybdenum-manganese metallization, as a ceramic type header often does, the package is first given a Hard Metal strike to coat the molybdenum-manganese metallization with a Hard Metal prior to coating with the Soft Metal and then the Hard Metal. The coated package is then heat treated in a nonoxidizing atmosphere; after which a semiconductor body having a circuit element with metal terminal tabs, such as aluminum, on a surface opposite an alloying surface such as, for example, an aluminum-germanium alloy or laminate, is alloyed to the package. Next, electrical conductors, such as, for example, aluminum wires are connected to the terminal pads of the semiconductor package and terminal tabs of the semiconductor body. The electrical conductors and connections are then coated with a thin film of silicone resin and cured in a nonoxidizing atmosphere to strengthen the wire and wire connections against any mechanical shock which might be generated therein by exposure to high radiation rays. Finally, the package is sealed to complete the process of fabricating a semiconductor packaged device.

DESCRIPTION OF THE PREFERRED EMBODIMENT

Figures 1B, 1C, 1D:
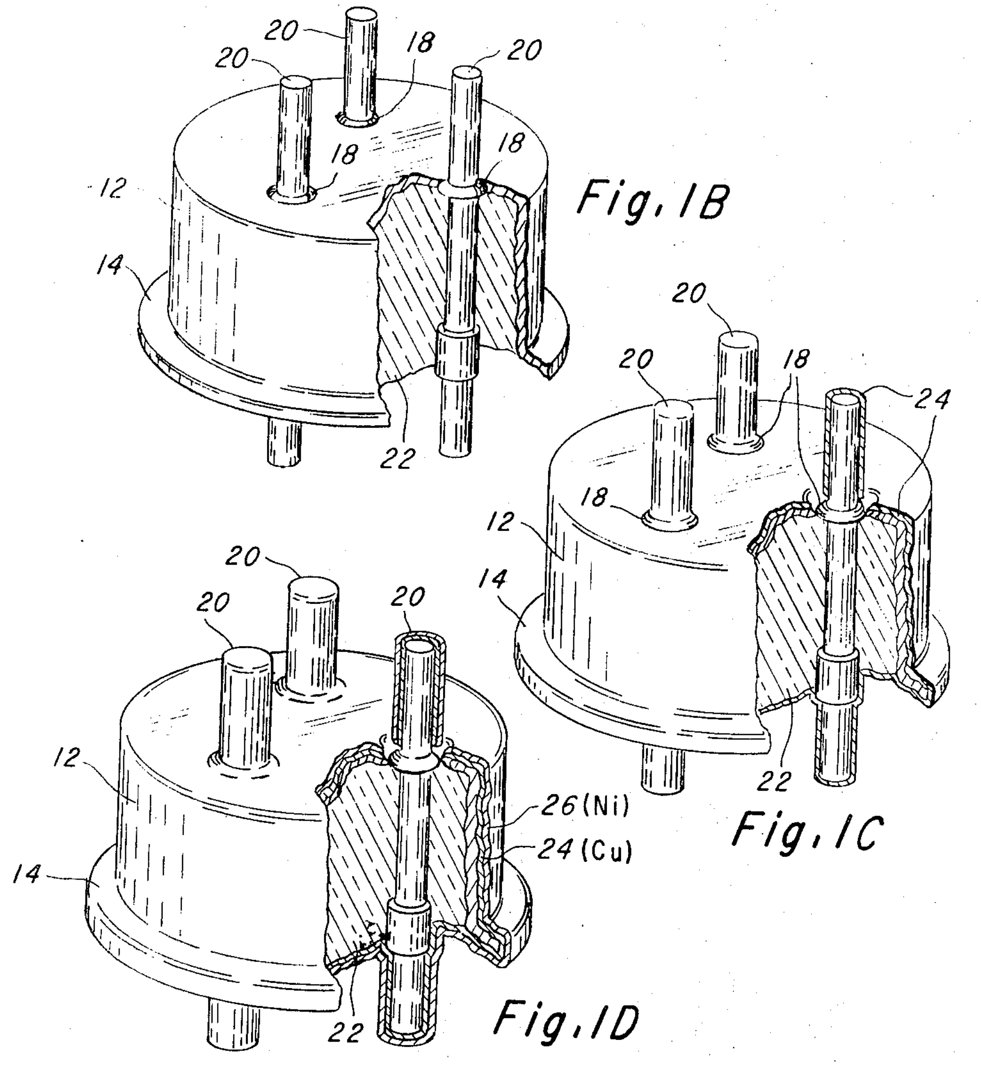
FIG. 1B is an isometric view of a semiconductor device package of the transistor TO-type which discloses one embodiment of this invention, with such view being partially sectionalized for graphic representation.
FIGS. 1C and 1D are isometric views of the semiconductor device package of FIG. 1A which show successive steps in the fabrication of the semiconductor device in accordance with this invention, with each of such views being partially sectionalized for graphic representation purposes.
Figure 1E:
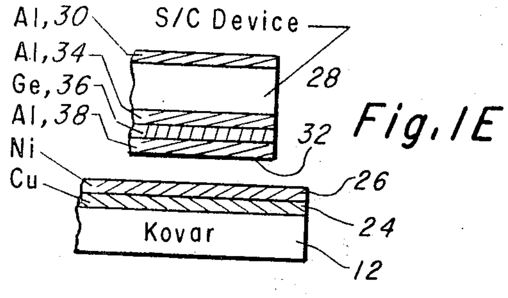
FIG. 1E is a fragmentary cross sectional view of the semiconductor body and package attachment area of this invention shown schematically for graphic simplicity purposes.
Figure 1A:
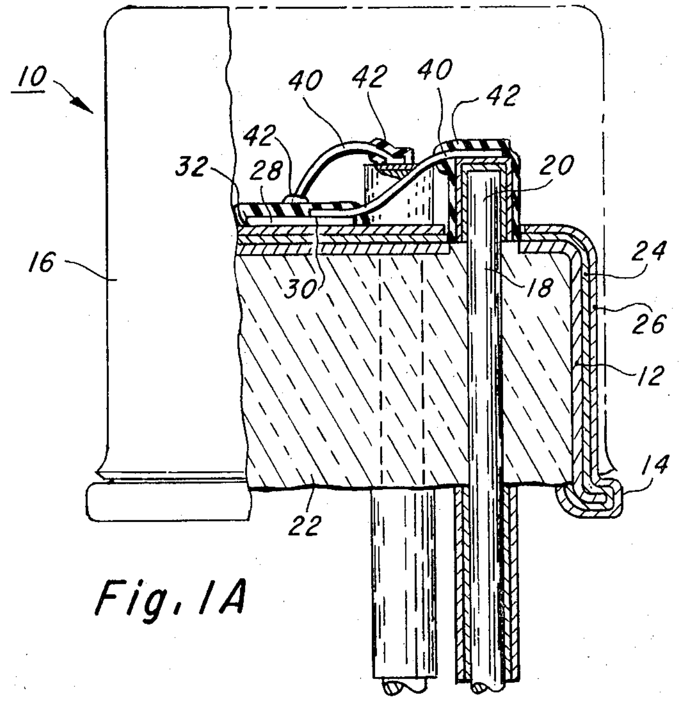
FIG. 1A is a front elevation view of a completed semiconductor packaged device fabricated in accordance with one embodiment of this invention, such view being partially sectionalized for graphic representation purposes.

A detailed description of a preferred embodiment of this invention follows with reference being made to the drawings wherein like parts have been given like reference numerals for clarity and understanding of the elements and features of this invention.

Referring to FIGS. 1A – 1E, there is shown by way of example only, a standard semiconductor package 10 of what is known in the art as the transistor TO-type header upon which the present invention may be practiced. It will be understood that the invention can be practiced on any of the standard type semiconductor packages, including flatpacks and dual in-line types. The semiconductor package 10 comprises a cup-shaped base 12 having an outwardly extending flanged lip 14 upon which a lid 16 (FIG. 1A) may be attached by welding for example to form a hermetically sealed package. The metal in the base 12 may be an alloy composed of 54 percent iron, 28 percent nickel, and 18 percent cobalt, which is sold under the trademark "Kovar." The cup-shaped metal base 12 has a plurality of apertures 18 through which electrical conductors 20 extend. In the transistor TO-type header, the electrical conductors 20 are "Kovar" metal posts which are insulated from the metal base 12 and hermetically sealed therein by a hard glass 22 which has substantially the same temperature coefficient of expansion as the "Kovar" metal base 12. An example of a suitable hard glass is sold as Corning Glass No. 7052, which is composed of 80 percent silicon dioxide ($SiO_2$), 14 percent boron oxide ($B_2O_3$), 04 percent sodium oxide ($Na_2O$) and 02 percent aluminum oxide ($Al_2O_3$). The hard glass 22 completely fills the cup-shaped metal base 12 and spaces the conductor posts 20 away from the walls of the apertures 18 to insulate the conductor posts from the cup-shaped metal base 12.

A plurality of the standard semiconductor packages 10, such as the transistor TO-type above described, may be mass-produced or batch processed as follows: The packages 10 are thoroughly cleaned to remove any grease or metal oxides. Although many commercial cleaning processes may be used, excellent results are obtained by scrubbing the packages 10 in a grease solvent, such as trichloroethylene; followed by rinsing in deionized water. After rinsing, the packages 10 are placed in a cathodic cleaner, using for example an alkaline electrolyte sold under the trademark "Endox-214," for cleaning at the rate of 10 amps/sq. ft. for 5 minutes, then rinsed again in deionized water and bathed for two minutes in a six molar solution of inhibited hydrochloric acid. The headers 10 are then given a final rinse in deionized water prior to receiving a layer of a Soft Metal. The remaining steps in the fabricating-/method of this invention follow:

A Soft Metal layer 24 having an atomic number less than 32, such as copper or aluminum, is formed on the cleaned headers 10 (FIG. 1C). The Soft Metal layer 24 is preferably 100 microinches thick and is preferably formed by an electroplating process. In the electroplating process, the headers 10 are made the cathode in a cell container and for a copper plate, rotated slowly in a copper cyanide electrolyte. This electroplating process has the advantage over other coating processes in that a uniform layer of any desired thickness can be obtained which adheres more tightly to the headers 10. After plating to a desired thickness, the headers 10 are removed and rinsed in preparation for receiving a hard metal coating.

A Hard Metal layer 26 (FIG. 1D), having an atomic number of less than 32 such as, for example, nickel, cobalt, chromium, manganese, vanadium or iron, is formed over the soft metal layer 24. The Hard Metal layer 26 preferably has a thickness of between about 30 microinches and about 125 microinches. A Hard Metal coating 26 formed by electroplating is preferred to other coating processes; for a nickel plate, the Soft Metal plated headers 10 are made the cathode in a cell and rotated slowly in an electrolyte commonly referred to as a Watts nickel solution. The Watts nickel solution consists of 45 oz./gal. nickel sulfate and 6 ox./gal. nickel chloride adjusted with boric acid to a pH between 2 and 3. After coating with a Hard Metal the headers 10 are removed, rinsed and given a heat treatment.

The heat treatment consists of placing the metal coated headers 10 in a non-oxidizing gaseous environment such as nitrogen, forming gas ($10\%H_2$—$90\%N_2$), or hydrogen and heating for 1 hour at a temperature of about 575° to 600°C. This heat treatment gives the headers 10 a soft surface formed by the metal coatings 24 and 26, to which reproducible conductor interconnections such as, for example, aluminum wire can be made by any wire bonding techniques including the vibratory bonding technique. After heat treating the semiconductor headers 10 are ready to receive semiconductor bodies 28 having formed therein electrical elements or components such as, for example, diodes, transistors, or integrated circuits.

Semiconductor bodies 28 (FIGS. 1A and 1E) having electrical components with bonding areas 30 on one surface are attached to the headers 10 by attaching the surface 32 of the semiconductor bodies 28 to the headers 10 by any suitable attachment technique. The preferred method of attachment is the aluminum-germanium alloy method described in U.S. Pat. application Ser. No. 51,255 filed June 30, 1970 now abandoned in favor of continuation application Ser. No. 280,399, filed Aug. 14, 1972. In this method, either an aluminum-germanium alloy is formed, preferably during the slice stage of fabricating semiconductor bodies from silicon or germanium slices, or a laminate is formed which consists of a first layer of aluminum 34, a layer of germanium 36, and a second layer of aluminum 38 using evaporation techniques to give the proper amount of aluminum for an aluminum-germanium eutectic composition. In the laminate embodiment, the germanium layer is covered with the second aluminum layer 38 to prevent the subsequent formation of germanium oxide (FIG. 1E) as the aluminum forms a thin protective aluminum oxide film. The attachment of the semiconductor body is made by heating the semiconductor body 28 and header 10 in a dry, non-oxidizing atmosphere such as, for example, dry nitrogen to about 50°C above the melting temperature of the aluminum-germanium alloy point or about 475°C to alloy the semiconductor device to the soft-hard metal coated surface of the header 10. After the semiconductor body 28 has been attached to the header 10, the bonding area 30 os the semiconductor body 28 and the electrical conductors 20 are interconnected.

The bonding area 30 of the semiconductor body 28 and the electrical conductors 20 of the header 10 may be interconnected using conventional ball bonding or wire bonding techniques. A preferred wire bonding technique is the vibratory bonding method. In this method a lead 40, such as, for example, a 1 percent silicon-aluminum wire (FIG. 1A), has one end 41 attached to the bonding area 30 by bonding energy imparted to the terminal lead 40 and bonding area 30 of the semiconductor body 28; and another end attached similarly to the electrical conductors or conductor posts 20. Although vibratory bonding techniques, often referred to as ultrasonic bonding, are well known in the art, a detailed description of the technique is set forth in U.S. Pat. No. 3,302,277 issued Feb. 7, 1967. To protect the leads 40 and their interconnection joints from any mechanical shock generated by high radiation energy, they are coated with an organic material.

The leads 40 and thier interconnections are strengthened and protected by a coating 42 (FIG. 1A) of organic material such as, for example, a silicone resin, sold under the trademark "D.C.646." The silicone resin coating 42 is cured in either a vacuum or a dry nitrogen atmosphere for about 12 hours. Although it is not exactly known how the coating 42 acts to protect the interconnections, it is believed the mechanical shock vibrations produced by exposure of the interconnections to high radiation energy are transferred from the leads 40 into the softer resin coating 42, where the vibrations are dampened rather than reflected back into the lead interconnections as the outer surface of an uncoated lead is believed to do; when the shock waves are reflected back, damage may result from a vibrating wave turbulence created within the leads and joints. After curing, the semiconductor packaged device is completed by covering with a protective cover, such as, for example, the lid 16.

A protective cover 16 (FIG. 1A) is used to complete the semiconductor packaged device. The protective cover may be, for example, the metal lid of the transistor TO-type package which is welded to the flange 14 of the header 10 to form a hermetically sealed package. For other standard type packages, an epoxy resin may be used to encapsulate the base 12 and other elements associated therewith.

Figure 2:
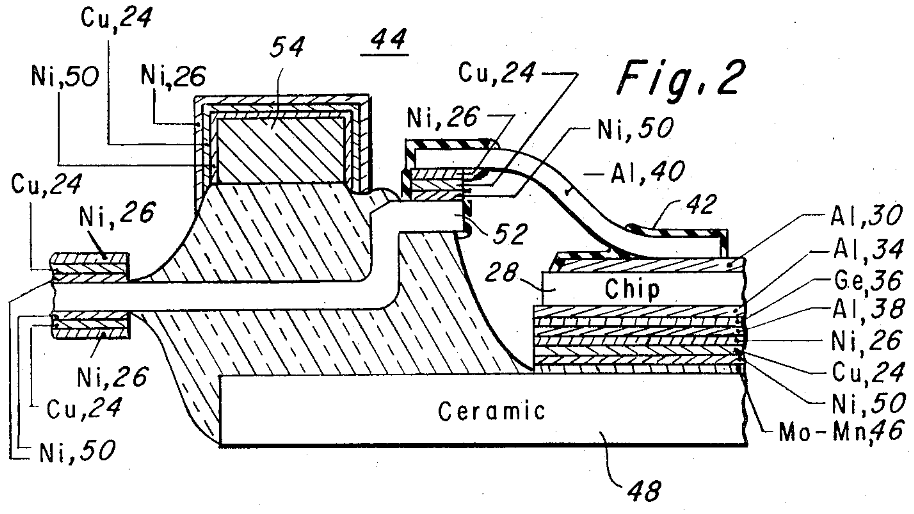
FIG. 2 is a cross sectional view of a flatpack type semiconductor package which shows another embodiment of the invention.

Another embodiment of the invention is shown in FIG. 2, in which a standard flatpack type semiconductor package 44 is used to demonstrate the embodiment. Other standard packages such as the transistor TO-type and dual in-line packages could be used. The package 44 has a molybdenum-manganese metallization 46 on a semiconductor body attachment area 48 made of, for example, a ceramic or glass material. In order to alloy the semiconductor body 28 having the aluminum-germanium alloy or laminate surface, it is preferable to first coat the molybdenum-manganese metallization 46 with a hard metal strike 50. A metal strike is the electro-deposition of a thin film of metal at a high current density. A nickel strike is preferred and is obtained by electroplating nickel from a Woods nickel solution having a composition of about 35 oz./gal. nickel chloride and about 14 fl. ozs. of 37% Hcl/gal. hydrochloric acid. During the striking process, the electrical conductors 52 and lead frame 54 can also be coated with the Hard Metal strike without interfering with their formation. Thereafter, the process is the same as that described above in more detail for the transistor TO-type package beginning with coating the semiconductor package 44 first with the Soft Metal coating 24, and then with the Hard Metal coating 26, prior to heat treating in a non-oxidizing atmosphere, such as nitrogen, forming gas, or hydrogen at about 575° – 600°C for 1 hour. A semiconductor body 28 is then attached. The semiconductor body 28, in the preferred form, has the aluminum layer 34 and the germanium layer 36 with the aluminum protective layer 38 formed thereon by evaporation techniques for alloying to the heat treated strike and Soft and Hard Metal layers. The semiconductor body 28 contains the electrical elements or components having terminal bonding areas 30 of a suitable material having an atomic number less than 32, such as, for example, aluminum. Electrical conductors 40 having an atomic number less than 32, such as aluminum, are then used to interconnect the semiconductor terminal bonding areas 30 to the electrical conductors 52 of the package base 44. The ends of the conductors 40 are attached preferably by the virbratory bonding technique. After attachment, the electrical conductors 40 and joints are coated with the silicone resin 42, and the semiconductor packaged device completed by welding a lid to the lead frame 54 of the semiconductor package base 44, or by encapsulating the package 44 with an epoxy resin.

Although the novel process of this invention has been described in connection with the standard transistor TO-type and flatpack type semiconductor packages, it is to be understood that the process and principles of the invention are applicable to the fabrication of many other types of packages. Further, although no particular type electrical element or component carried and supported by the semiconductor body has been described, many semiconductor devices of the discrete and integrated circuit type have been used in the novel technique of this invention.

What is claimed is:

1. A method of fabricating a package for a semiconductor device comprising the steps of:

selectively depositing a soft metal comprising an elemental metal having an atomic number less than 32 and taken from the group consisting of copper and aluminum on a base member for a semiconductor device package having a semiconductor body attach area and electrical conductors arranged in insulated relationship to the semiconductor body attach area so as to cover the semiconductor body attach area and exposed portions of said electrical conductors with a soft metal layer;

selectively depositing a hard metal metallurigically compatible with said soft metal and comprising an elemental metal having an atomic number less than 32 and taken from the group consisting of nickel, cobalt, chromium, vanadium, manganese and iron on the base member and the exposed portions of said electrical conductors so as to cover the semiconductor body attach area and exposed portions of said electrical conductors with at least one hard metal layer such that the outer metal layer formed on said semiconductor body attach area and exposed portions of said electrical conductors is said at least one hard metal layer preceded by said soft metal layer;

heat treating the metal layered base member and exposed portions of said electrical conductors in a non-oxidizing atmosphere to form the semiconductors body attach area and the exposed portions of said electrical conductors respective heat-treated metallized surfaces;

mounting a semiconductor device containing at least one circuit element on said heat-treated metallized surface of the semiconductor body attach area in secured relation thereto; and electrically connecting the said at least one circuit element of said semiconductor device to the heat treated metallized surface of the exposed portion of at least one of the electrical conductors by vibration bonding of the opposite ends of an electrically conductive interconnecting lead to said at least one circuit element of said semiconductor device and said heat-treated metallized surface of the exposed portion of said at least one of the electrical conductors.

2. A method as set forth in claim 1, wherein the vibration bonding is accomplished ultrasonically.

3. A method as set forth in claim 1, further including coating the bond areas of said at least one circuit element of said semiconductor device and said heat-treated metallized surface of the exposed portion of said at least one electrical conductor at the opposite ends of the interconnecting lead with a mechanical shock absorbing material.

4. A method as set forth in claim 1, wherein the heat treating of the metal layered base member and exposed portions of said electrical conductors comprises heating the metal layered base member and exposed portions of said electrical conductors for one hour at a temperature of about 575° to about 600°C in a non-oxidizing gaseous atmosphere.

5. A method as set forth in claim 1, wherein said soft metal layer is a copper deposit, and said hard metal layer is a nickel deposit.

6. A method as set forth in claim 5, wherein the respective depositions of copper and nickel are accomplished by electroplating.

7. A method as set forth in claim 1, wherein the electrically conductive interconnecting lead whose opposite ends are bonded to said at least one circuit element of said semiconductor device and said heat-treated metallized surface of the exposed portion of said at least one electrical conductor is an aluminum wire.

8. A method as set forth in claim 1, wherein the soft metal is selectively deposited on the base member and the exposed portions of said electrical conductors so as to cover the semiconductor body attach area and the exposed portions of said electrical conductors with a soft metal layer having a substantially uniform thickness of at least 100 microinches.

9. A method as set forth in claim 8, wherein the hard metal is selectively deposited on the base member and the exposed portions of said electrical conductors so as to form an outer metal layer on said semiconductor body attach area and the exposed portions of said electrical conductors of hard metal having a substantially uniform thickness in the range of between about 30 and about 125 microinches.

10. A method as set forth in claim 1, further including selectively depositing a hard metal melallurgically compatible with said soft metal and comprising an elemental metal having an atomic number less than 32 and taken from the group consisting of nickel, cobalt, chromium, vanadium, manganese and iron on the base member and the exposed portions of said electrical conductors so as to cover the semiconductor body attach area and the exposed portions of said electrical conductors with a first hard metal layer prior to the selective deposition of the soft metal forming the soft metal layer.

11. A method as set forth in claim 10, wherein the first hard metal layer is a nickel strike, and said first hard metal layer being covered with a soft metal layer of copper having a thickness of about 100 microinches, and said soft metal copper layer being covered by a second hard metal layer of nickel comprising said outer metal layer and having a thickness in the range of between about 30 and about 125 microinches.

* * * * *